(12) United States Patent
Wang et al.

(10) Patent No.: US 11,581,433 B2
(45) Date of Patent: Feb. 14, 2023

(54) METHOD FOR MANUFACTURING A LATERAL DOUBLE-DIFFUSED METAL-OXIDE-SEMICONDUCTOR (LDMOS) TRANSISTOR

(71) Applicant: Silergy Semiconductor Technology (Hangzhou) LTD, Hangzhou (CN)

(72) Inventors: Meng Wang, Hangzhou (CN); Yicheng Du, Hangzhou (CN); Hui Yu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/308,205

(22) Filed: May 5, 2021

(65) Prior Publication Data

US 2021/0257490 A1    Aug. 19, 2021

Related U.S. Application Data

(63) Continuation of application No. 16/417,813, filed on May 21, 2019, now Pat. No. 11,031,497.

(30) Foreign Application Priority Data

May 30, 2018    (CN) .......................... 201810538418.6

(51) Int. Cl.
*H01L 29/78*    (2006.01)
*H01L 21/82*    (2006.01)
(Continued)

(52) U.S. Cl.
CPC .. *H01L 29/7816* (2013.01); *H01L 21/823493* (2013.01); *H01L 21/823814* (2013.01); *H01L 21/823857* (2013.01); *H01L 21/823864* (2013.01); *H01L 21/823878* (2013.01); *H01L 21/823892* (2013.01); *H01L 27/088* (2013.01); *H01L 27/0922* (2013.01); *H01L 27/0928* (2013.01); *H01L 29/0623* (2013.01); *H01L 29/1095* (2013.01); *H01L 29/66681* (2013.01)

(58) Field of Classification Search
CPC ......... H01L 29/7816; H01L 21/823493; H01L 29/0623; H01L 21/823814; H01L 21/823878; H01L 27/088; H01L 27/0922
USPC ....................................................... 257/327
See application file for complete search history.

(56) References Cited

U.S. PATENT DOCUMENTS 5,158,463 A    10/1992    Kim et al.
5,933,731 A    8/1999    Tanimoto et al.
(Continued)

FOREIGN PATENT DOCUMENTS

TW    I523233 B    2/2016

*Primary Examiner* — Didarul A Mazumder

(57) ABSTRACT

A semiconductor device can include: a substrate having a first doping type; a first well region located in the substrate and having a second doping type, where the first well region is located at opposite sides of a first region of the substrate; a source region and a drain region located in the first region, where the source region has the second doping type, and the drain region has the second doping type; and a buried layer having the second doping type located in the substrate and below the first region, where the buried layer is incontact with the first well region, where the first region is surrounded by the buried layer and the first well region, and the first doping type is opposite to the second doping type.

9 Claims, 22 Drawing Sheets

(51) Int. Cl.
*H01L 21/8238* (2006.01)
*H01L 27/092* (2006.01)
*H01L 29/10* (2006.01)
*H01L 29/66* (2006.01)
*H01L 21/8234* (2006.01)
*H01L 27/088* (2006.01)
*H01L 29/06* (2006.01)

(56) References Cited

U.S. PATENT DOCUMENTS

| | | | |
|---|---|---|---|
| 7,018,899 B2 | 3/2006 | Sung | |
| 7,074,659 B2 | 7/2006 | Zuniga et al. | |
| 7,230,302 B2 | 6/2007 | Lotfi et al. | |
| 7,372,104 B2 | 5/2008 | Wu et al. | |
| 7,888,222 B2 | 2/2011 | You et al. | |
| 7,981,739 B1 | 7/2011 | You et al. | |
| 7,999,318 B2 | 8/2011 | Zuniga et al. | |
| 8,063,444 B2 | 11/2011 | Chang | |
| 8,119,507 B2 | 2/2012 | You | |
| 8,293,612 B2 | 10/2012 | Lee | |
| 8,319,283 B2 | 11/2012 | Min et al. | |
| 8,431,450 B1 | 4/2013 | Zuniga et al. | |
| 8,455,340 B2 | 6/2013 | Zuniga et al. | |
| 8,574,973 B1 | 11/2013 | You et al. | |
| 8,581,344 B2 | 11/2013 | Liu | |
| 8,716,790 B2 | 5/2014 | Lotfi et al. | |
| 8,716,795 B2 | 5/2014 | You | |
| 8,912,600 B2 | 12/2014 | You | |
| 9,614,074 B1 * | 4/2017 | Lin | H01L 29/063 |
| 10,262,997 B2 | 4/2019 | Lin et al. | |
| 2005/0073007 A1 | 4/2005 | Chen et al. | |
| 2006/0006462 A1 * | 1/2006 | Chang | H01L 29/7391 257/E21.549 |
| 2010/0001345 A1 * | 1/2010 | Furuhata | H01L 27/0922 257/E29.261 |
| 2010/0052052 A1 | 3/2010 | Lotfi et al. | |
| 2010/0187606 A1 * | 7/2010 | Kobayashi | H01L 21/823814 257/E29.256 |
| 2013/0200453 A1 | 8/2013 | Park | |
| 2014/0001549 A1 | 1/2014 | Bode et al. | |
| 2014/0320174 A1 | 10/2014 | Lu et al. | |
| 2017/0179279 A1 | 6/2017 | Lin et al. | |
| 2017/0200785 A1 * | 7/2017 | Janssens | H01L 27/088 |
| 2018/0174887 A1 | 6/2018 | Chuang | |
| 2019/0081045 A1 * | 3/2019 | Lin | H01L 29/1087 |

* cited by examiner

METHOD FOR MANUFACTURING A LATERAL DOUBLE-DIFFUSED METAL-OXIDE-SEMICONDUCTOR (LDMOS) TRANSISTOR

RELATED APPLICATIONS

This application is a continuation of the following application, U.S. patent application Ser. No. 16/417,813, filed on May 21, 2019, and which is hereby incorporated by reference as if it is set forth in full in this specification, and which also claims the benefit of Chinese Patent Application No. 201810538418.6, filed on May 30, 2018, which is incorporated herein by reference in its entirety.

FIELD OF THE INVENTION

The present invention generally relates to semiconductor devices, and more particularly to laterally diffused metal oxide semiconductor devices and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). An output filter, can include an inductor and a capacitor, and may be coupled between the input voltage source and the load to filter the output of the switch, and thus provide the output DC voltage. A controller (e.g., a pulse-width modulator, a pulse frequency modulator, etc.) can control the switch to maintain a substantially constant output DC voltage. Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
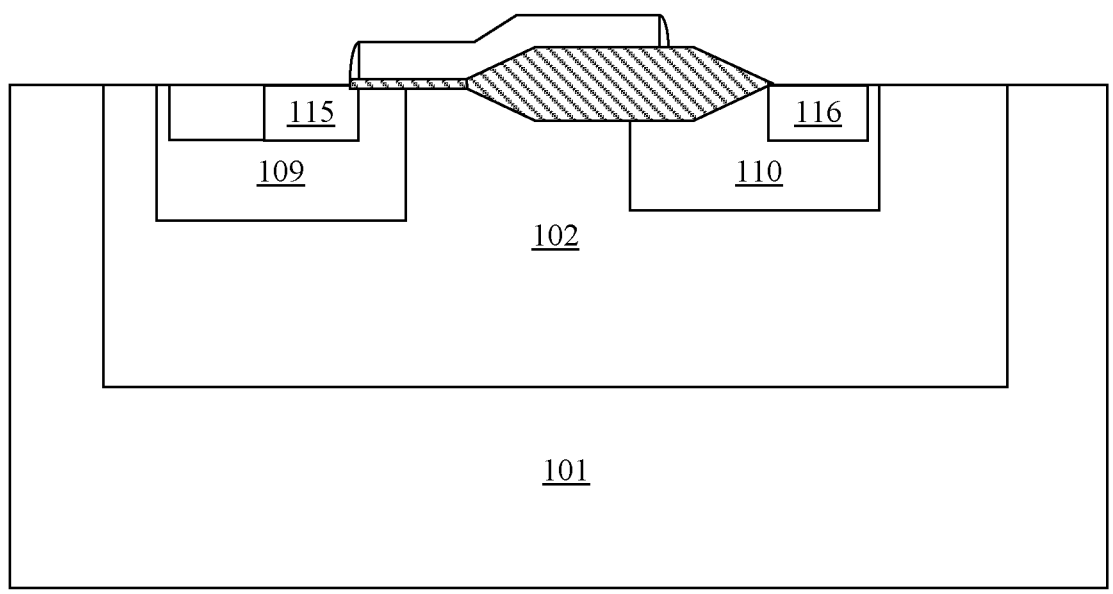
FIG. 1 is a cross-sectional diagram of an example LDMOS structure.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

The power switch in a switching converter/regulator may be a semiconductor transistor (e.g., a metal-oxide-semiconductor field-effect transistor [MOSFET], an insulated gate bipolar transistor [IGBT], etc.). A laterally diffused metal oxide semiconductor (LDMOS) is widely used in switching regulators as the main power switch.

Referring now to FIG. 1, shown is a cross-sectional diagram of an example LDMOS structure. In this example, N-type well region 102 may be formed in substrate 101, body region 109 and drift region 110 may both be located in well region 102, source region 115 can be formed in body region 109, and drain region 116 may be formed in drift region 110. Drain region 116 can withstand high voltages due to the presence of drift region 110. Therefore, LDMOS transistors have advantages of relatively large drive current, low on-resistance, and high breakdown voltage, and as such are widely used in switching regulators. However, a relatively large junction depth may be required by well region 102 in some cases, and as a result well region 102 may need to be formed separately and not be combined with other processes (e.g., for CMOS structures). In addition, in order to reduce the on-resistance Rdson of an LDMOS transistor, a doping concentration of drift region 110 should not be too low. Further, to increase the breakdown voltage BV of LDMOS transistors, the doping concentration of drift region 110 should not be too high. This makes optimization of the breakdown voltage and on-resistance Rdson of a typical LDMOS device very difficult.

In one embodiment, a semiconductor device can include: (i) a substrate having a first doping type; (ii) a first well region located in the substrate and having a second doping type, where the first well region is located at opposite sides of a first region of the substrate; (iii) a source region and a drain region located in the first region, where the source region has the second doping type, and the drain region has the second doping type; and (iv) a buried layer having the second doping type located in the substrate and below the first region, where the buried layer is incontact with the first well region, where the first region is surrounded by the buried layer and the first well region, and the first doping type is opposite to the second doping type.

In one embodiment, a method of manufacturing a semiconductor structure, can include: (i) forming, by a first implanting process, a plurality of separate first well regions having a same doping type in a substrate; (ii) forming, by a second implanting process, a plurality of separate second well regions having a same doping type in the remaining region of the substrate; and (iii) forming corresponding power regions in each of the second well regions to form first type power transistors, where the forming the first well regions further comprising forming, by the same first implanting process, a plurality of separate third well regions in the substrate together with the first well regions and having the same doping type as the first well regions.

In one embodiment, a semiconductor structure can include: (i) a plurality of separate first well regions and third well regions having the same junction depth and doping type in a substrate; (ii) a plurality of separate second well regions having the same junction depth and doping type in remaining regions of the substrate; and (iii) corresponding power regions located in each of the second well regions, where first type power transistors are formed by power regions and each of second well regions corresponding to each of power regions.

Figure 2A:
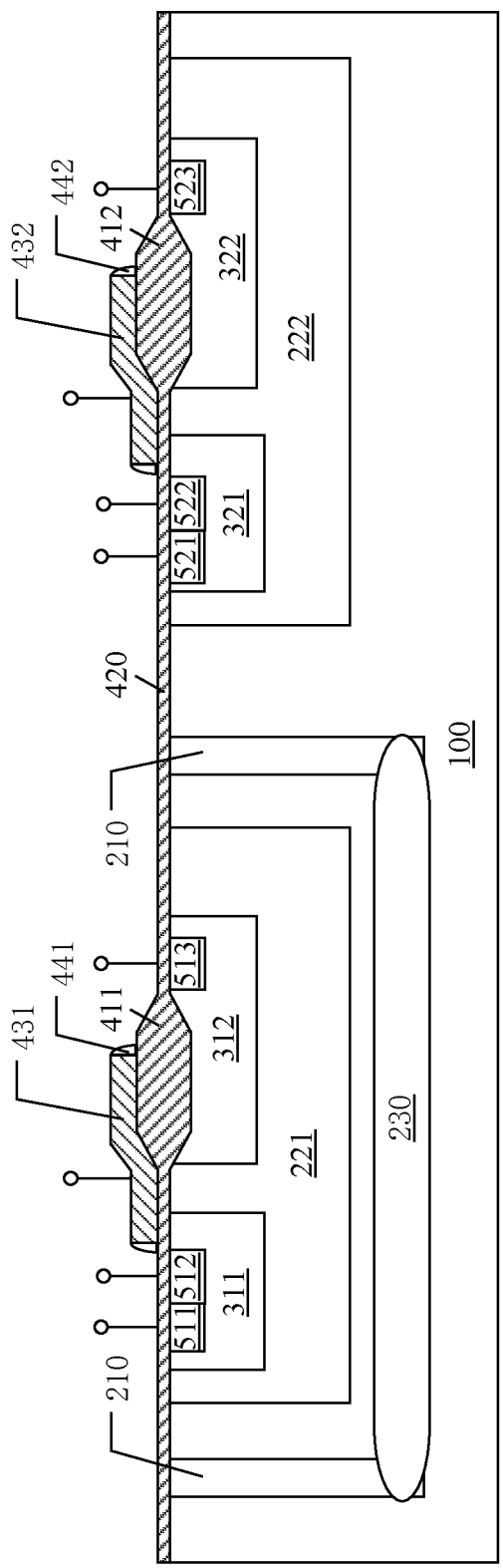
FIG. 2A is a cross-sectional diagram of a first example semiconductor device, in accordance with embodiments of the present invention.

Referring now to FIG. 2A, shown is a cross-sectional diagram of a first example semiconductor device, in accordance with embodiments of the present invention. In this particular example, the semiconductor device can include a high-voltage side structure and a low-voltage side structure. The high-voltage side structure and the low-voltage side structure may share substrate 100 and gate oxide layer 420. The high-voltage side structure can include substrate 100, well region 210, deep well region 221, buried layer 230, body region 311, drift region 312, high-voltage drain oxide layer 411, gate oxide layer 420, gate conductor 431, sidewall spacer 441, body contact region 511, source region 512, drain region 513, and a first lightly doped drain region.

The low-voltage side structure can include substrate 100, deep well region 222, body region 321, drift region 322, gate oxide layer 420, high-voltage drain oxide layer 412, gate conductor 432, sidewall spacer 442, body contact region 521, source region 522, drain region 523, and a second lightly doped drain region. For example, substrate 100, deep well region 221, deep well region 222, body region 311, body region 321, body contact region 511, and body contact region 521 are a first doping type. Also for example, well region 210, buried layer 230, drift region 312, drift region 322, source region 512, drain region 513, source region 522, and drain region 523 are a second doping type, and the first doping type is opposite to the second doping type. The first doping type is one of an N-type and a P-type, and the second doping type is the other of the N-type and the P-type.

For example, the doping type of substrate 100 is the P-type. Well region 210 can be located in substrate 100, and surrounds region 10 (see, e.g., FIG. 3A) of substrate 100. For example, well region 210 can be located at opposite sides of region 10 of substrate 100. One end of well region 210 may be in contact with buried layer 230, and the other end can extend to a surface of substrate 100. The doping type of well region 210 is N-type, whereby the dopant can include phosphorus. Buried layer 230 can be located in substrate 100 and below region 10, and buried layer 230 may not be in in contact with deep well region 221. The doping type of buried layer 230 may be N-type, whereby the dopant can include phosphorus. Buried layer 230 and well region 210 may together surround region 10 to form an N-type cavity structure embedded in substrate 100.

Deep well regions 221 and 222 may be located in substrate 100, where deep well region 221 is located in region 10. The doping type of deep well regions 221 and 222 may be P-type, whereby the dopant can include boron. Body region 311 and drift region 312 can be located in deep well region 221, and at least a portion of deep well region 221 may be located between body region 311 and drift region 312. Body region 321 and drift region 322 can be located in deep well region 222, and at least a portion of deep well region 222 may be located between body region 321 and drift region 322. The doping type of body regions 311 and 321 may be P-type, whereby the dopant can include boron. The doping type of drift regions 312 and 322 may be N-type, whereby the dopant can include phosphorus.

Body contact region 511 can be adjacent to source region 512. Body contact region 511 and source region 512 can be located in body region 311. Drain region 513 may be located in drift region 312. Body contact region 521 may be adjacent to source region 522. Body contact region 521 and source region 522 can be located in body region 321. Drain region 523 may be located in drift region 322. The first and second lightly doped drain regions can respectively be located in body regions 311 and 312. The doping type of body contact region 511 and body contact region 521 can be P-type. The doping type of source region 512, drain region 513, source region 522, drain region 523, the first and second lightly doped drain regions can be N-type. The doping concentration of the first lightly doped drain region may be less than that of drain region 513, and the doping concentration of the second lightly doped drain region may be less than that of drain region 523.

Gate oxide layer 420 can be located on a surface of substrate 100. High-voltage drain oxide layer 411 can be disposed on a surface of drift region 312 and adjacent to gate oxide layer 420. Gate conductor 431 may be disposed on high-voltage drain oxide layer 411 and gate oxide layer 420. One end of gate conductor 431 can extend to above a side of source region 512 closer to drift region 312, and the other end of gate conductor 431 may extend to above drift region 312. Sidewall spacer 441 may be located on surfaces of the both sidewalls of gate conductor 431. For example, at least a portion of deep well region 221 can be located below gate conductor 431 between source region 512 and drain region 513. Further, at least a portion of deep well region 221 may be located below gate oxide layer 420 between body region 311 and drift region 312. High-voltage drain oxide layer 412 may be located on a surface of drift region 322 and is adjacent to gate oxide layer 420.

Gate conductor 432 may be disposed on high-voltage drain oxide layer 412 and gate oxide layer 420. One end of gate conductor 432 can extend to above a side of source region 522 closer to drift region 322, and the other end of gate conductor 432 may extend to above drift region 322. Sidewall spacer 442 may be located on surfaces of the both sidewalls of gate conductor 432. For example, at least a portion of deep well region 222 can be located below gate conductor 432 between source region 522 and drain region 523. Further, at least a portion of deep well region 222 can be located below gate oxide layer 420 between body region 321 and drift region 322. For example, the material of gate conductors 431 and 432 can include polysilicon.

In particular embodiments, the difference between the high-voltage side structure and the low-voltage side structure is that the high-voltage side structure can include buried layer 230. That is, well region 210 and buried layer 230 may together surround region 10 to form the high-voltage side structure. The introduction of N-type buried layer 230 can ensure normal operation of the high-voltage side structure without affecting the breakdown voltage BV of the device and the on-resistance Rdson of the device. In addition, the introduction of buried layer 230 can further optimize breakdown voltage BV and on-resistance Rdson of the device based on previous BCD process architectures, and with little additional cost.

For example, by adding deep well regions 221 and 222 in the semiconductor device, the concentration peak of deep well region 221 and the concentration peak of deep well region 222 can be concentrated below drift regions 312 and 322, respectively. In this way, the compromise of the breakdown voltage BV and the on-resistance Rdson of the low-voltage side structure and high-voltage side structure can be optimized. Further, sufficient P-type impurity can be provided under drift regions 312 and 322 by adjusting the concentration distribution of deep well region 221 and the concentration distribution of deep well region 222, thereby improving the breakdown voltage BV of semiconductor device. Further, the compromise of the breakdown voltage BV and the on-resistance Rdson of the semiconductor device may be optimized by increasing the doping concentration of drift regions 312 and 322.

Figure 2B:
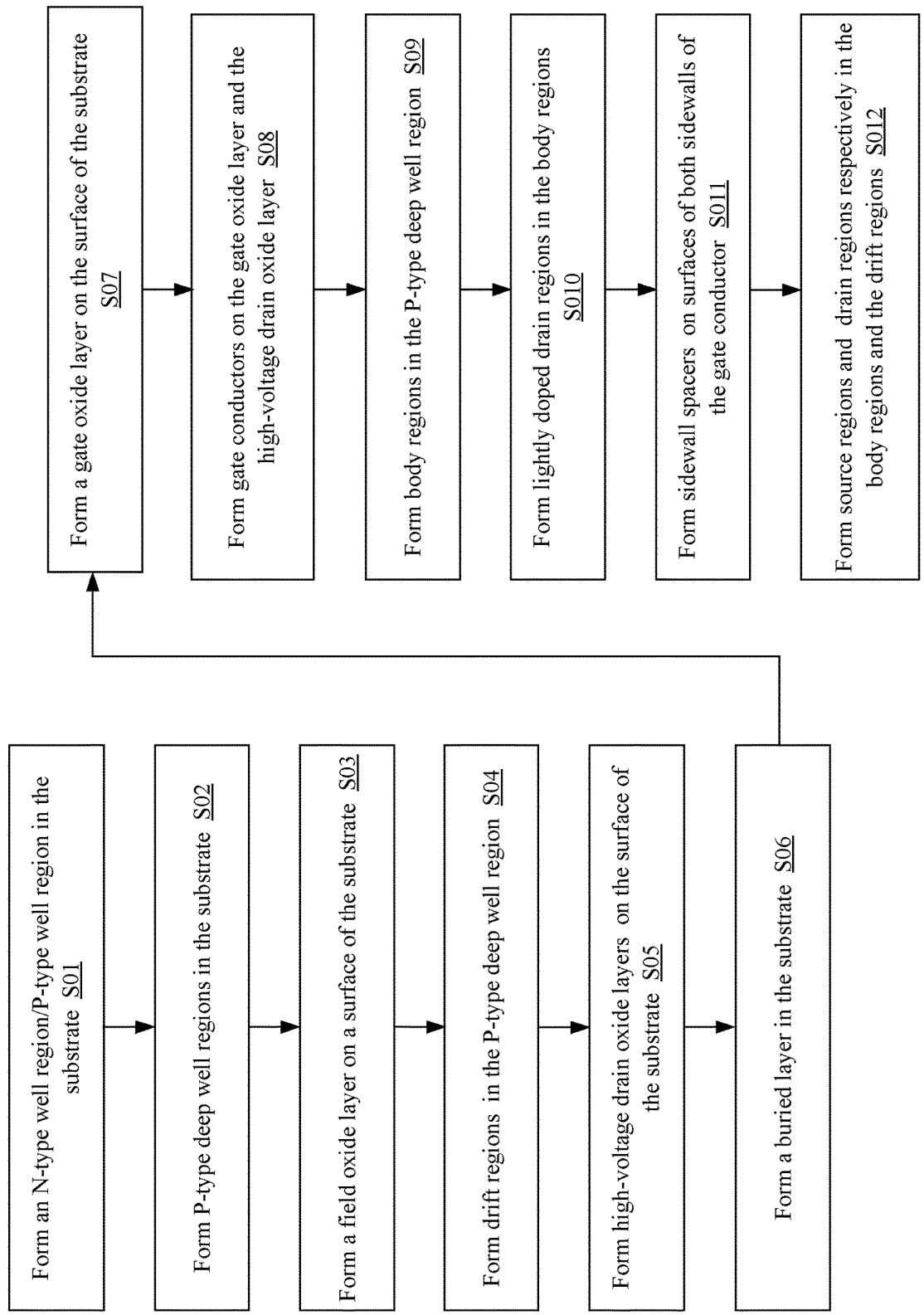
FIG. 2B is a flow diagram of an example method of manufacturing the first example semiconductor device, in accordance with embodiments of the present invention.

Referring now to FIG. 2B, shown is a flow diagram of an example method of manufacturing the first example semiconductor device, in accordance with embodiments of the present invention. Referring also to FIGS. 3A-3I, shown are cross-sectional diagrams of example steps for manufacturing the first example semiconductor device, in accordance with embodiments of the present invention.

Figure 3A:
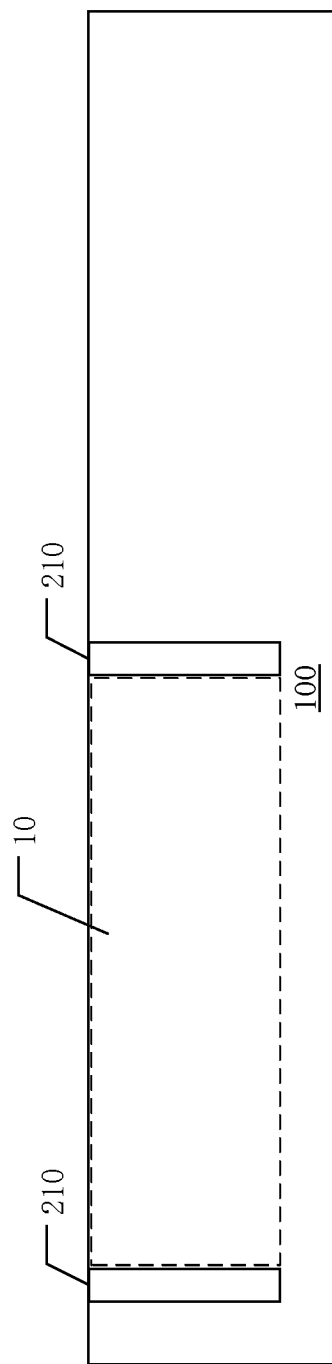
FIGS. 3A-3I are cross-sectional diagrams of example steps for manufacturing the first example semiconductor device, in accordance with embodiments of the present invention.

In S01 of FIG. 2B, an N-type well region/P-type well region may be formed in the substrate. As shown in FIG. 3A, well region 210 may be formed in substrate 100, e.g., by ion implantation. Well region 210 can be located at opposite sides of region 10 of substrate 100, and region 10 may be surrounded by well region 210. Well region 210 can also utilized to lead out a buried layer formed in a subsequent step. The doping type of substrate 100 can be P-type. The doping type of well region 210 can be N-type, whereby the dopant may include phosphorus. In other cases, the doping type of well region 210 may also be P-type.

Figure 3B:
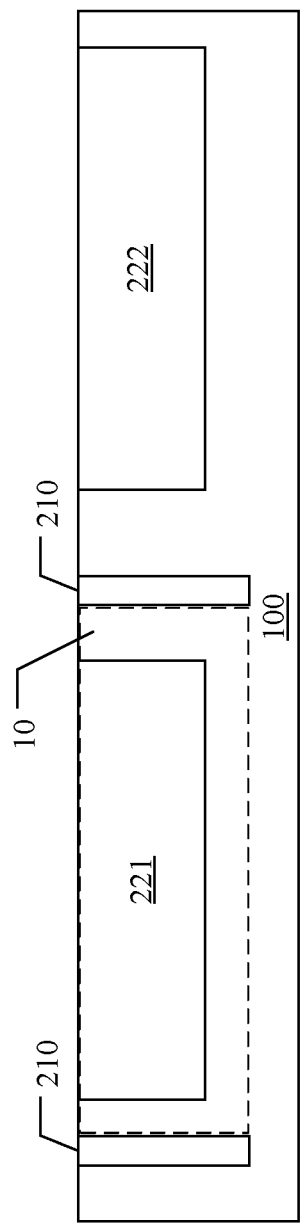

In S02 of FIG. 2B, P-type deep well regions can formed be in the substrate. As shown in FIG. 3B, deep well regions 221 and 222 can be formed in substrate 100, e.g., by ion implantation. For example, deep well region 221 may be located in region 10. Also, the doping concentration of deep well region 221 and the doping concentration of deep well region 222 may be adjusted in order to increase the breakdown voltage (BV) of the semiconductor device. The doping type of deep well regions 221 and 222 can be P-type, whereby the dopant may include boron.

In S03 of FIG. 2B, a field oxide layer can be formed on a surface of the substrate. For example, the field oxide layer may formed on a surface of the substrate by a local oxidation of silicon (LOCOS) process.

Figure 3C:
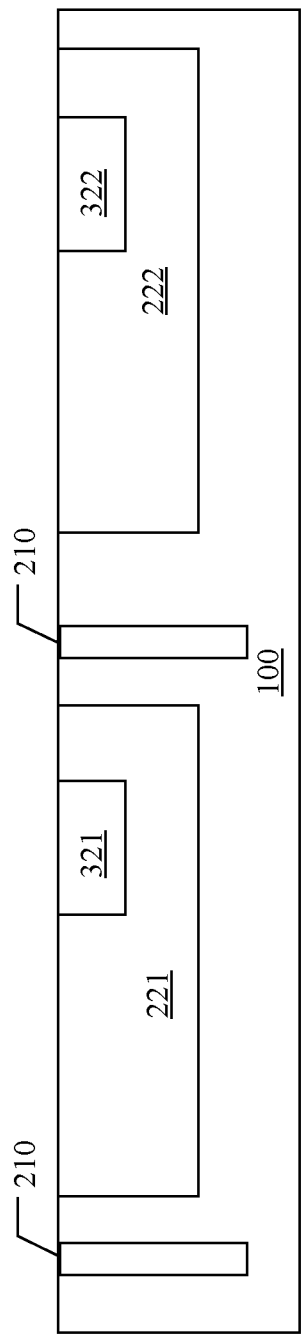

In S04 of FIG. 2B, drift regions may be formed in the P-type deep well region. As shown in FIG. 3C, drift regions 321 and 322 may be formed in deep well regions 221 and 222, e.g., by ion implantation, respectively. In particular embodiments, the best compromise or optimization of breakdown voltage BV and on-resistance Rdson of the semiconductor device may be achieved by adjusting the doping concentration of drift regions 321 and 322. The doping type of drift regions 321 and 322 can be N-type, whereby the dopant can include phosphorus.

Figure 3D:
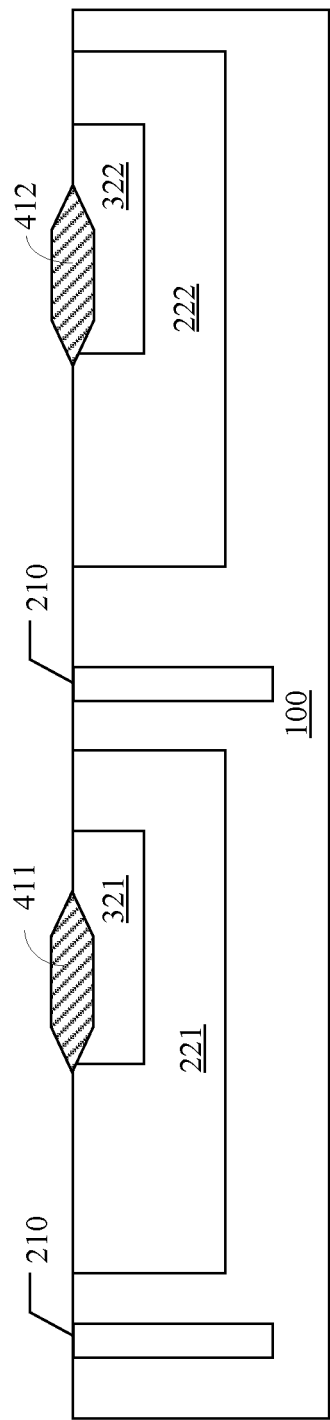

In S05 of FIG. 2B, high-voltage drain oxide layers can be formed on the surface of the substrate. As shown in FIG. 3D, first and second high voltage drain regions can be defined by a mask, and high-voltage drain oxide layer 411 and high-voltage drain oxide layer 412 can be formed in the corresponding first and second high-voltage drain regions, e.g., by the LOCOS process.

Figure 3E:
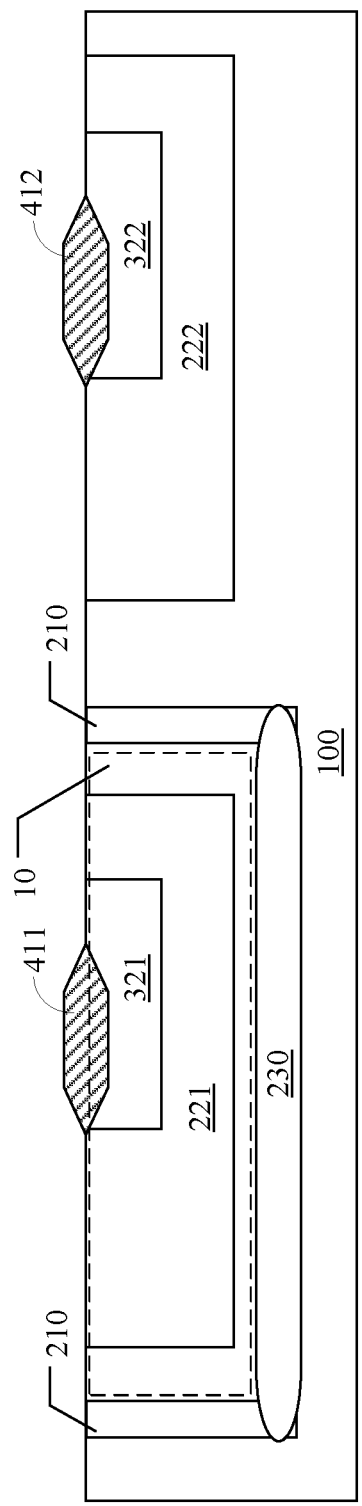

In S06 of FIG. 2B, a buried layer can be formed in the substrate. As shown in FIG. 3E, buried layer 230 may be formed in region 10 of substrate 100, e.g., by ion implantation. Buried layer 230 can be located below deep well region 221, and may not be in contact with deep well region 221. Deep well region 221 may be surrounded by well region 210 and buried layer 230. Also, one end of well region 210 can be in contact with buried layer 230, and the other end of well region 210 may extend to the surface of substrate 100. The doping type of buried layer 230 can be N-type, whereby the dopant can include phosphorus.

Figure 3F:
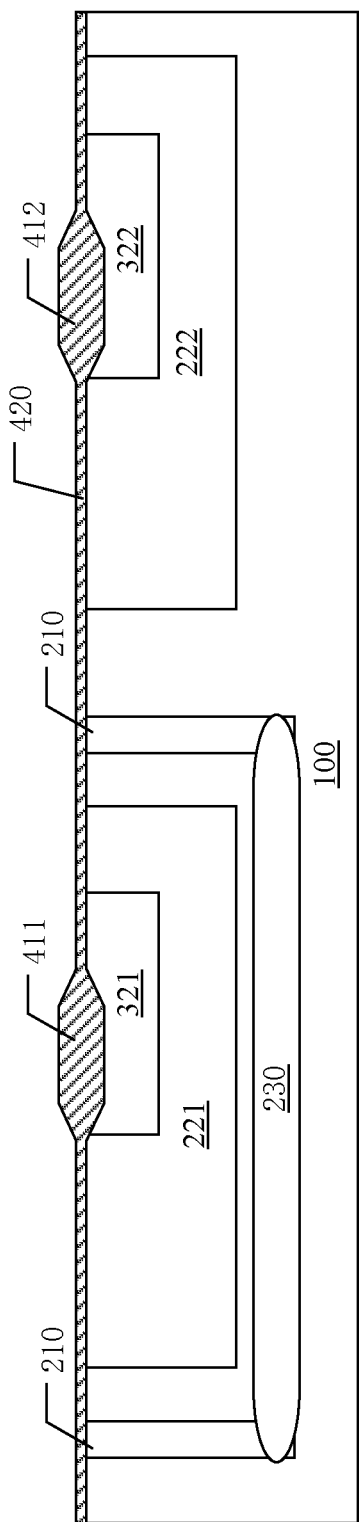

In S07 of FIG. 2B, a gate oxide layer may be on the surface of substrate 100. As shown in FIG. 3F, gate oxide layer 420 can be formed on regions of the surface of substrate 100 that are not covered by a high-voltage drain oxide layer. Also, gate oxide layer 420 can be adjacent to high-voltage drain oxide layers 411 and 412.

Figure 3G:
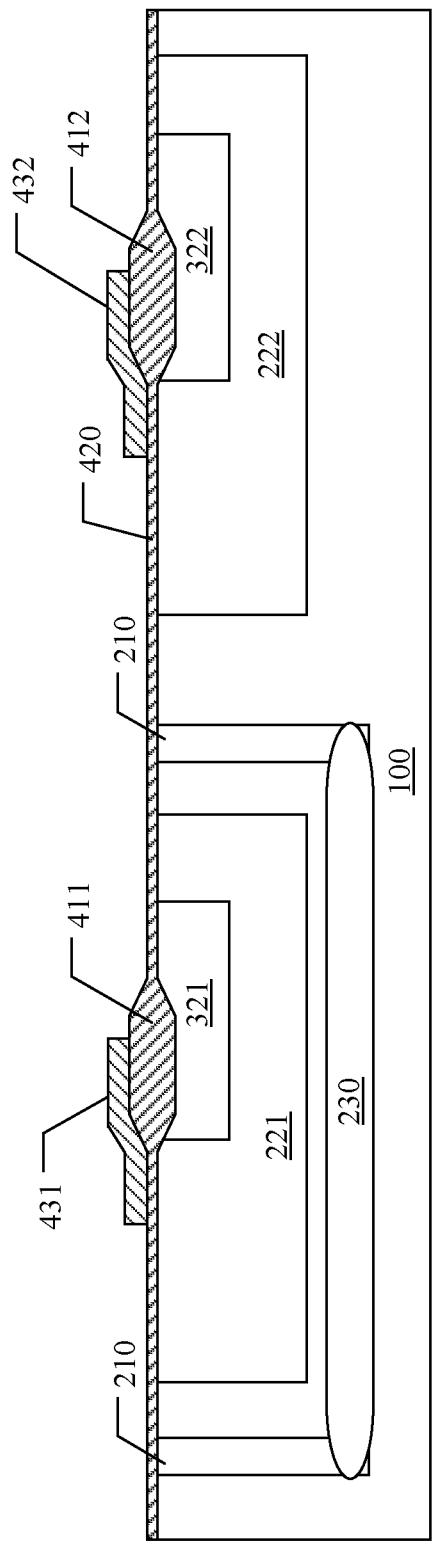

In S08 of FIG. 2B, gate conductors can be formed on the gate oxide layer and the high-voltage drain oxide layer. As shown in FIG. 3G, gate conductor 431 can be formed on a portion of gate oxide layer 420 and a portion of high-voltage drain oxide layer 411. Gate conductor 432 may be formed on a portion of gate oxide layer 420 and a portion of high-voltage drain oxide layer 412. For example the material of gate conductors 431 and 432 can include polysilicon.

Figure 3H:
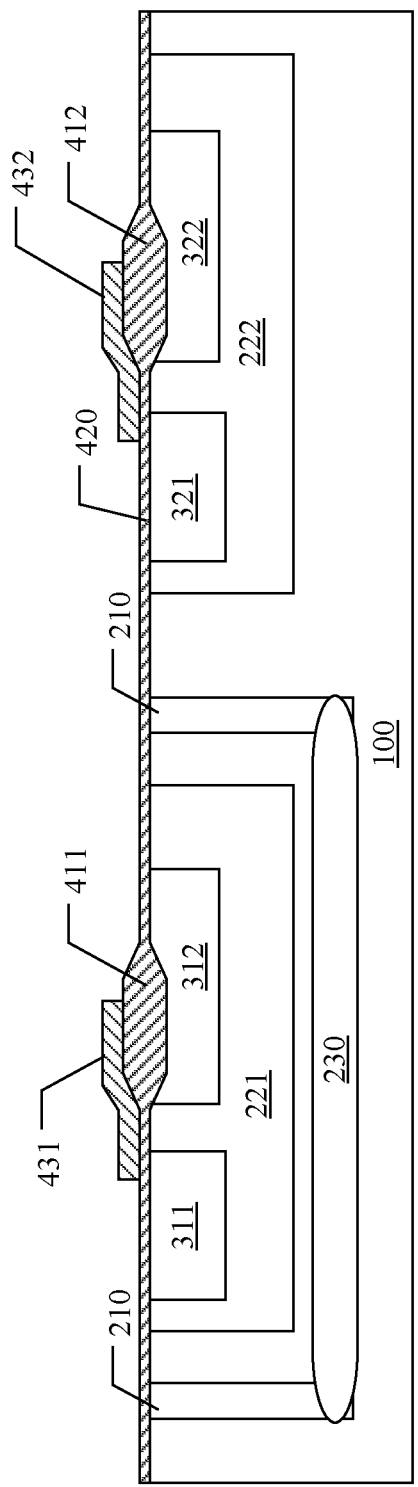

In S09 of FIG. 2B, body regions can be formed in the P-type deep well regions. As shown in FIG. 3H, body region 311 may be formed in deep well region 221, and body region 312 may be formed in deep well region 222, e.g., by ion implantation. At least a portion of deep well region 221 can be located between body region 311 and drift region 312, and at least a portion of deep well region 222 may be located between body region 321 and drift region 322. The threshold voltage of the semiconductor device may be determined by the doping concentration of body regions 311 and 321. The doping type of body regions 311 and 321 can be P-type, whereby the dopant may include boron.

In S010 of FIG. 2B, a lightly doped drain region may be formed in the body region. As shown in FIG. 3H, a lightly doped drain region can be formed in a body region of the semiconductor device by using high-voltage drain oxide layer 411 and gate conductor 431 as a hard mask. Also, the doping type of the lightly doped drain region can be N-type.

Figure 3I:
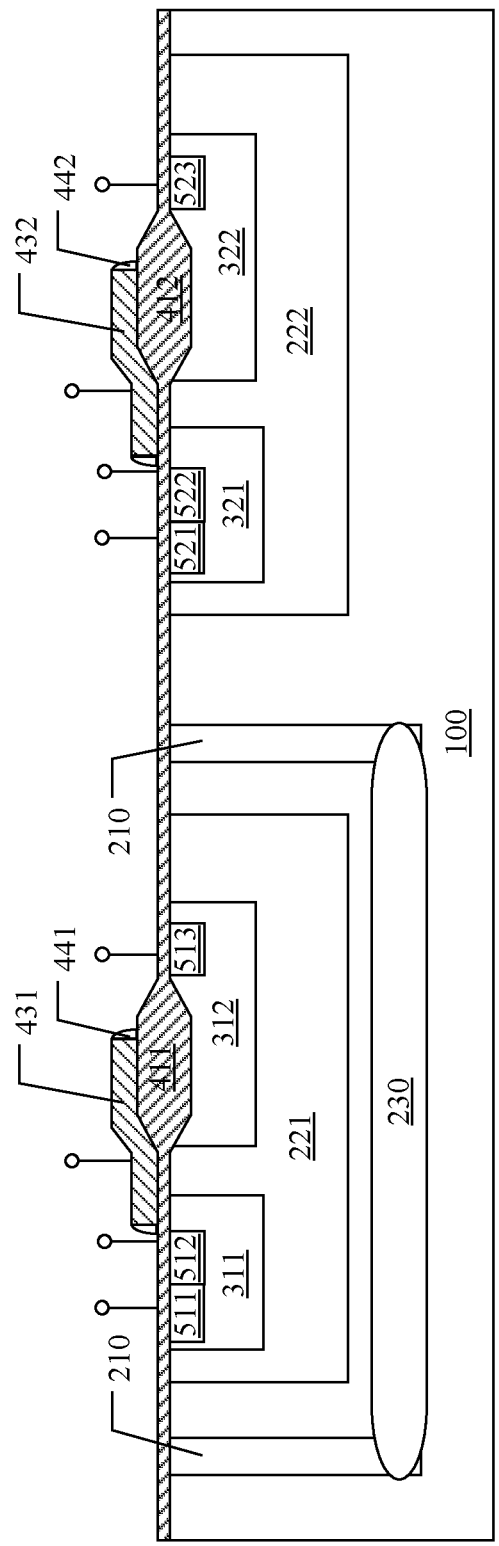

In S011 of FIG. 2B, sidewall spacers may be formed on surfaces of both sidewalls of the gate conductor. As shown in FIG. 3I, sidewall spacers 441 can be formed on surfaces of both sidewalls of gate conductor 431. Also, spacers 442 may be formed on surfaces of both sidewalls of gate conductor 432.

In S012 of FIG. 2B, source regions and drain regions may be formed in the body regions and the drift regions, respectively. As also shown in FIG. 3I, high-voltage drain oxide layer 411, gate conductor 431, and sidewall spacer 441 can be used as a hard mask to form body contact region 511 and source region 512 in body region 311, and also to form drain region 513 in drift region 312, e.g., by ion implantation. High-voltage drain oxide layer 412, gate conductor 432, and sidewall spacer 442 may be used as a hard mask to form body contact region 521 and source region 522 in body region 321, and to form drain region 523 in drift region 322, e.g., by ion implantation.

Figure 4:
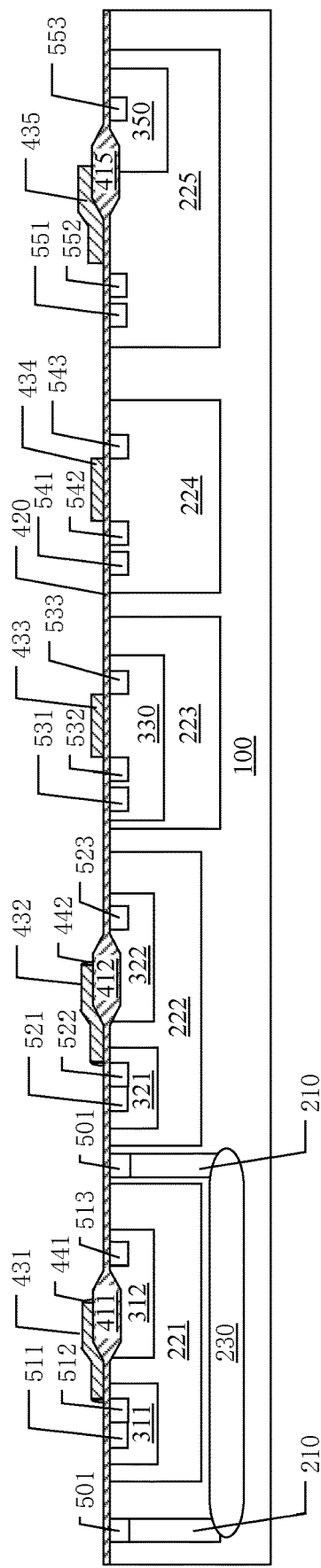
FIG. 4 is a cross-sectional diagram of a second example semiconductor device, in accordance with embodiments of the present invention.

Referring now to FIG. 4, shown is a cross-sectional diagram of a second example semiconductor device, in accordance with embodiments of the present invention. In this particular example, the semiconductor device can include N-type LDMOS, NMOS, PMOS, and PAMOS (P-type asymmetry MOSFET), and the doping type of substrate 100 is P-type. In this particular example, isolation region 501 may be formed in well region 210. The NMOS can include substrate 100, N-type well region 223, P-type well region 330, gate oxide layer 420, gate conductor 433, body contact region 531, source region 532, and drain region 533.

N-type well region 223 can be located in substrate 100, and P-type well region 330 may be located in N-type well region 223. Body contact region 531, source region 532, and drain region 533 can be located in P-type well region 330. Gate oxide layer 420 may be located on a surface of substrate 100, and gate conductor 433 can be located on gate oxide layer 420 between source region 532 and drain region 533. The PMOS can include substrate 100, N-type well region 224, gate oxide layer 420, gate conductor 434, body contact region 541, source region 542, and drain region 543.

N-type well region 224 may be located in substrate 100. Body contact region 541, source region 542, and drain region 543 can be located in N-type well region 224. Gate oxide layer 420 may be located on the surface of substrate 100. Gate conductor 434 can be located on gate oxide layer 420 between source region 542 and drain region 543. The PAMOS can include substrate 100, N-type well region 225, P-type well region 350, high-voltage drain oxide layer 415, gate oxide layer 420, gate conductor 435, body contact region 551, source region 552, and drain region 553. N-type well region 225 can be located in substrate 100, P-type well region 350 may be located in N-type well region 225. Body contact region 551 and source region 552 can be located in N-type well region 225.

Drain region 553 can be located in P-type well region 350. Gate oxide layer 420 may be located on the surface of substrate 100, high-voltage drain oxide layer 415 may be located on a surface of N-type well region 225 and can be adjacent to gate oxide layer 420. Gate conductor 435 may be located on a portion of high-voltage drain oxide layer 415 and gate oxide layer 420. One end of gate conductor 435 may extend to above source region 552, and the other end can extend to above P-type well region 350. At least a portion of N-type well region 225 can be located below the gate conductor 435 between source region 552 and drain region 553. In particular embodiments, the junction depth of well region 210 may be substantially the same as the junction depth of N-type well region 223, N-type well region 224, and N-type well region 225. Thus, well region 210, N-type well region 223, N-type well region 224, and N-type well region 225 may be formed together by one process.

Figure 5A:
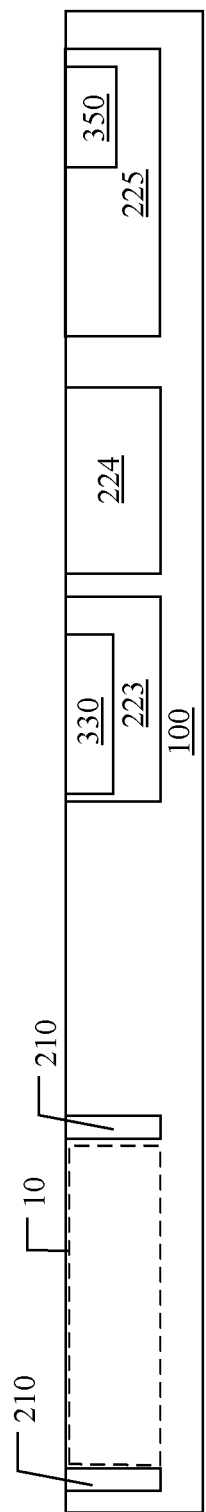
FIGS. 5A-5I are cross-sectional diagrams of example steps for manufacturing the second example semiconductor device, in accordance with embodiments of the present invention.

Referring now to FIGS. 5A-5I, shown are cross-sectional diagrams of example steps for manufacturing the second example semiconductor device, in accordance with embodiments of the present invention. As shown in FIG. 5A, well region 210, N-type well region 223, N-type well region 224, and N-type well region 225 may be formed together in substrate 100, e.g., by ion implantation process. P-type well region 330 can be formed in N-type well region 223, and P-type well region 350 may be formed in N-type well region 225. Region 10 of substrate 100 may be surrounded by well region 210, and well region 210 can be located at opposite sides of region 10 of the substrate. Well region 210 may also be used in order to lead out a buried layer formed in a subsequent step. The doping type of substrate 100 may be P-type. The doping type of well region 210 can be N-type, whereby the dopant can include phosphorus. In other examples, the doping type of well region 210 may be P-type.

Figure 5B:
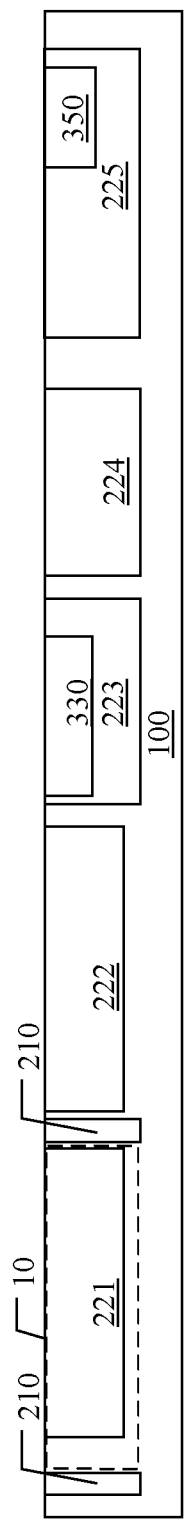

As shown in FIG. 5B, deep well regions 221 and 222 may be formed in substrate 100, e.g., by ion implantation process. For example, deep well region 221 can be located in region 10. The doping concentration of deep well region 221 and the doping concentration of deep well region 222 can be adjusted in order to increase the breakdown voltage BV of the semiconductor device. The doping type of deep well region 221 and the doping type of deep well region 222 can be P-type, whereby the dopant may include boron. Thereafter, a field oxide layer can be formed on a surface of the substrate. For example, a field oxide layer may be formed on a surface of the substrate by a LOCOS process.

Figure 5C:
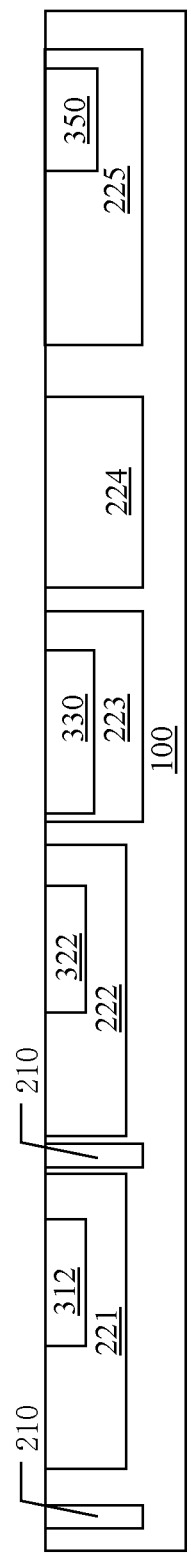

As shown in FIG. 5C, drift region 312 and drift region 322 may respectively be formed in deep well regions 221 and 222, e.g., by an ion implantation process. In particular embodiments, a compromise/optimization of breakdown voltage BV and the on-resistance Rdson of the semiconductor device may be achieved by adjusting the doping concentration of drift regions 321 and 322. The doping type of drift regions 321 and 322 can be N-type, whereby the dopant may include phosphorus.

Figure 5D:
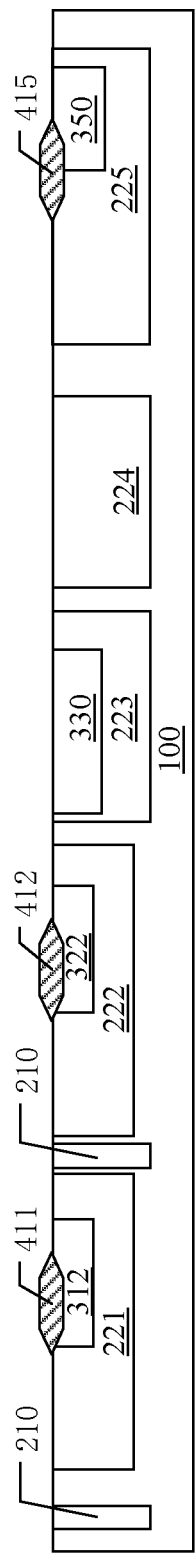

As shown in FIG. 5D, first, second, and third high-voltage drain regions can be defined by a mask, and high-voltage drain oxide layers 411, 412, and 415 may be formed in the corresponding first, second, and third high-voltage drain regions, e.g., by a LOCOS process.

Figure 5E:
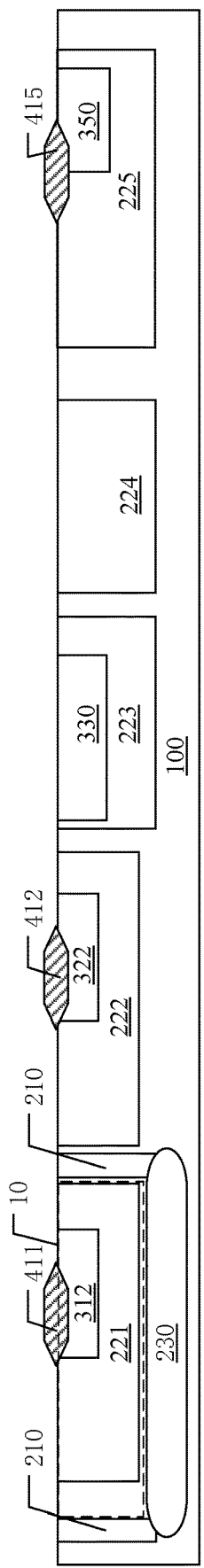

As shown in FIG. 5E, buried layer 230 may be formed in substrate 100 by ion implantation process, and buried layer 230 can be located below deep well region 221 and not in contact with deep well region 221. Deep well region 221 may be surrounded by well region 210 and buried layer 230. One end of well region 210 can be in contact with buried layer 230, and the other end of well region 210 may extend to the surface of substrate 100. The doping type of buried layer 230 may be N-type, whereby the dopant can include phosphorus.

Figure 5F:
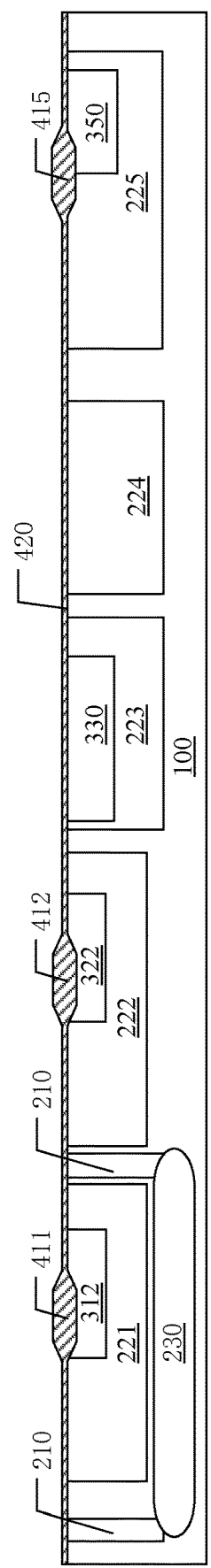

As shown in FIG. 5F, gate oxide layer 420 may be formed on a region of the surface of the substrate 100 that is not covered by a high-voltage drain oxide layer. Gate oxide layer 420 can be in contact with high-voltage drain oxide layers 411, 412, and 415.

Figure 5G:
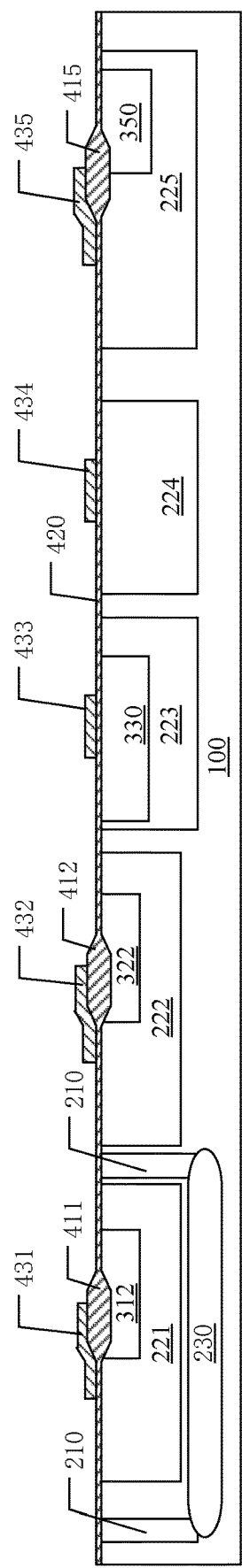

As shown in FIG. 5G, gate conductor 431 can be formed on gate oxide layer 420 and high-voltage drain oxide layer 411. Gate conductor 432 may be formed on gate oxide layer 420 and high-voltage drain oxide layer 412. Gate conductor 433 can be formed on gate oxide layer 420 located on P-type well region 330. Gate conductor 434 may be formed on gate oxide layer 420 located on N-type well region 224. Gate conductor 435 can be formed on gate oxide layer 420 and high-voltage drain oxide layer 451. For example, gate conductors 431, 432, 433, 434, and 435 may each include polysilicon.

Figure 5H:
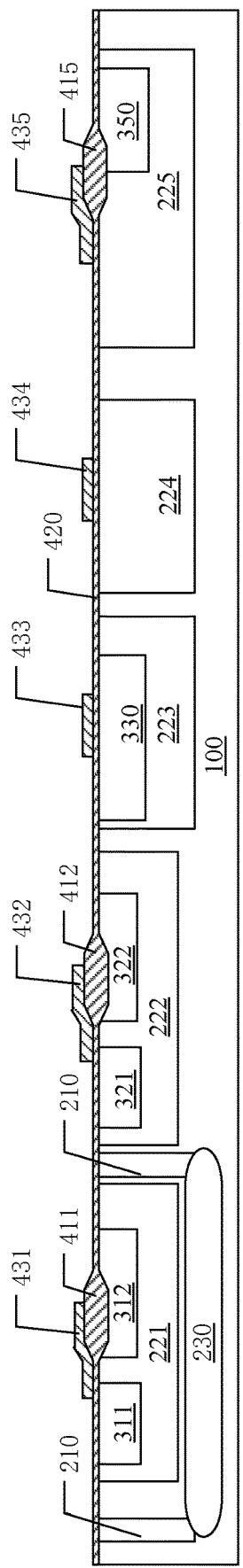

As shown in FIG. 5H, body region 311 can be formed in deep well region 221, and body region 321 may be formed in deep well region 222, e.g., by ion implantation. At least a portion of deep well region 221 may be located between body region 311 and drift region 312. At least a portion of deep well region 222 can be located between body region 321 and drift region 322. The doping type of body regions 311 and 321 may be P-type, whereby the dopant can include boron. A lightly doped drain region can be formed in the body region of the semiconductor device by using high-voltage drain oxide layer 411 and gate conductor 431 as a hard mask. Also, the doping type of the lightly doped drain region can be N-type.

Figure 5I:
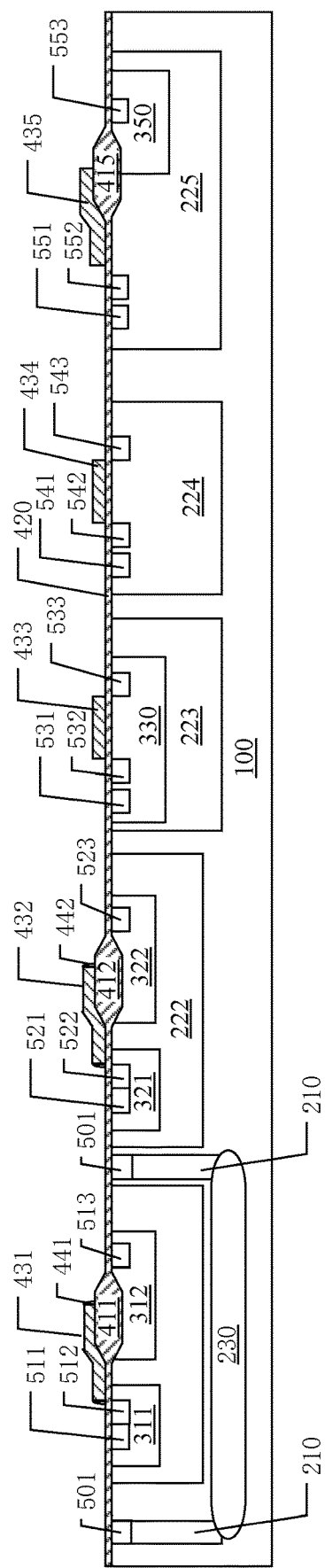

As shown in FIG. 5I, sidewall spacers 441 may be formed on surfaces of both sidewalls of gate conductor 431. Also, sidewall spacers 442 may be formed on surfaces of both sidewalls of gate conductor 432. High-voltage drain oxide layer 411, gate conductor 431, and sidewall spacers 441 may be used as a hard mask to form body contact region 511 and source region 512 in body region 311, and to form drain region 513 in drift region 312, e.g., by ion implantation. High-voltage drain oxide layer 412, gate conductor 432, and sidewall spacers 442 may be used as a hard mask to form body contact region 521 and source region 522 in body region 321, and to form drain region 523 in drift region 322, e.g., by ion implantation. Body contact region 531, source region 532, and drain region 533 may be formed in P-type well region 330 by using gate conductor 532 as a hard mask. Body contact region 541, source region 542, and drain region 543 can be formed in N-type well region 224 by using gate conductor 542 as a hard mask. High-voltage drain oxide layer 415 and gate conductor 451 can be used as a hard mask to form body contact region 551 and source region 552 in N-type well region 225, and to form drain region 553 in P-type well region 350, e.g., by ion implantation.

In particular embodiments, semiconductor devices and methods for manufacturing the same, can include a source/drain region being formed in a first region of a substrate, and a first well region and a buried layer being formed in the substrate to surround the first region. A well region with a relatively large junction depth in other approaches may be replaced by the first well region and the buried layer of particular embodiments. In this way, forming the first well region together with the well region of other devices (e.g., CMOS devices) facilitates process combination.

In particular embodiments, semiconductor devices and methods for manufacturing the same, can include a first deep well region having a doping type different from the drift region being formed in the substrate. The peak of the doping concentration of the first deep well region may be distributed below the drift region by adjusting the doping concentration distribution of the first deep well region. As a result, the breakdown voltage BV and the on-resistance Rdson of the low-voltage side structure and high-voltage side structure of the semiconductor device can be optimized. In particular embodiments, the breakdown voltage BV and the on-resistance Rdson can further be optimized by adjusting the doping concentration of the drift region.

In particular embodiments, semiconductor devices and methods for manufacturing the same, can include a buried layer being formed below the first region of the semiconductor device, and a cavity structure surrounding the first region being composed by the buried layer and the first well region to form the high-voltage side structure of the semiconductor device. In addition, the buried layer can be connected to the upper surface of the substrate by the first well region to separate the high-voltage side structure from the low-voltage side structure of the semiconductor device. Normal operation of the high-voltage side structure can thus be guaranteed without affecting the on-resistance Rdson and breakdown voltage BV of the semiconductor device.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a semiconductor structure, the method comprising:
    a) forming, by a first implanting process, a plurality of separate first well regions having a same doping type in a substrate;
    b) forming, by a second implanting process, a plurality of separate second well regions having a same doping type in the remaining region of the substrate; and
    c) forming power regions in each of the plurality of separate second well regions to form first type power transistors,
    d) wherein forming the plurality of separate first well regions further comprising forming, by the first implanting process, a plurality of separate third well regions in the substrate together with the plurality of separate first well regions and having the same doping type as the plurality of separate first well regions.

2. The method according to claim 1, further comprising forming power regions in each of the plurality of separate third well regions to form power transistors different from the first type power transistors.

3. The method according to claim 1, further comprising forming a buried layer in the substrate, wherein the buried layer is located below one of the plurality of separate second well regions, and wherein the buried layer and the plurality of separate first well regions have the same doping type.

4. The method according to claim 3, wherein the plurality of separate first well regions are located at opposite sides of the plurality of separate second well regions, wherein the buried layer is in contact with the plurality of separate first well regions, and the plurality of separate second well regions are surrounded by the buried layer and the plurality of separate first well regions.

5. The method according to claim 2, further comprising forming, by a LOCOS process, high-voltage drain oxide layers on a surface of the plurality of separate second well regions and/or on a surface of at least one of the plurality of separate third well regions.

6. The method according to claim 5, further comprising selectively forming a gate oxide layer on a remaining surface of the substrate.

7. The method according to claim 6, further comprising forming gate conductors on the gate oxide layer and the high-voltage drain oxide layers to form gate structures of the power transistors.

8. The method according to claim 2, wherein forming the power regions further comprises:
    a) forming, by a third implanting process, drain regions/source regions having a first doping type; and
    b) forming, by a fourth implanting process, drain regions/source regions having a second doping type.

9. The method according to claim 8, further comprising, when forming the drain regions/source regions having the second doping type, forming an isolation region in the plurality of separate first well regions.

* * * * *